(12) United States Patent
Misek (10) Patent No.: US 6,188,057 B1
(45) Date of Patent: Feb. 13, 2001

(54) METHOD AND APPARATUS FOR TESTING PHOTO-RECEIVER ARRAYS AND ASSOCIATED READ CHANNELS

(75) Inventor: Brian J. Misek, Fort Collins, CO (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/152,091

(22) Filed: Sep. 11, 1998

(51) Int. Cl.[7] ............................. H01L 27/146; H04N 3/14

(52) U.S. Cl. .................................. 250/208.1; 250/214 R; 348/294

(58) Field of Search .......................... 250/208.1, 208.2, 250/214 R; 257/291, 292, 431, 461; 348/294, 296, 302, 303, 304, 306, 308, 311, 313

(56) References Cited

U.S. PATENT DOCUMENTS

| 5,149,980 | 9/1992 | Ertel et al. ................... 250/559.32 |
| 5,451,768 | * 9/1995 | Hosier et al. ................... 250/208.1 |
| 5,769,384 | 6/1998 | Baumgartner et al. .......... 250/214 A |
| 6,078,358 | * 6/2000 | Bird ................................. 250/208.1 |
| 6,104,020 | * 8/2000 | Knee et al. ....................... 250/208.1 |

OTHER PUBLICATIONS

U.S. Patent Application Ser. No. 09/040,640 of Badyal et al. filed Mar. 18, 1998, entitled "CMOS Digital Optical Navigation Chip".

U.S. Patent Application Ser. No. 09/024,092 of Knee et al. filed Feb. 17, 1998, entitled "Electronic Shutter for a Low Differential Light Level Photo–Receiver Cell".

\* cited by examiner

Primary Examiner—John R. Lee (57) ABSTRACT

Disclosed herein are a method and apparatus for testing photo-receiver arrays and their associated read channels. A photo-receiver array may include one or a plurality of photo-receivers. Each photo-receiver may include a capacitor for storing a charge which is indicative of how much light has entered the photo-receiver. A first number of multiplexors have inputs for reading the charge off of at least one capacitor of at least one of the plurality of photo-receivers, and an input for receiving first test voltages. The outputs of the first number of multiplexors are connected to a charge transfer stage. Select inputs of the first number of multiplexors serve to couple each multiplexor's output with one or more of its inputs. In this manner, charges may be read from the integration capacitors of the photo-receivers, or charges determined by the first test voltages may be placed on the integration capacitors for subsequent reading. When combined with illumination and shutter control of the photo-receivers, the photo-receivers and their read channels may be fully tested, and tested prior to packaging of the photo-receivers and their read channels in an integrated circuit. Outputs of the charge transfer stage are multiplexed with second test voltages into a stage including one or more analog-to-digital converters. This second multiplexing may be accomplished in a manner which is similar to the first multiplexing, so that the analog-to-digital converters may also be tested—preferably prior to testing of the photo-receiver array and charge transfer stage.

16 Claims, 5 Drawing Sheets

FIG. 5 ature metal oxide silicon (CMOS) technology supporting chips performing this processing cause slight imperfections and variations in the physical CMOS structure (e.g., non-linearity, device mismatches, power supply issues), to substantially affect a predictable and repeatable performance of such analog systems. As a result, analog optical navigation systems are not very suitable for mass manufacture.

METHOD AND APPARATUS FOR TESTING PHOTO-RECEIVER ARRAYS AND ASSOCIATED READ CHANNELS

FIELD OF THE INVENTION

The invention pertains to the testing of photo-receiver arrays and associated read channels, and more particularly, to the testing of photo-receiver arrays and associated read channels which are constructed within a single integrated circuit.

BACKGROUND OF THE INVENTION

An accurate determination of the path of a device across a surface is important in a variety of applications. For example, in the field of optical scanners, there must be accurate information as to the travel of the scanning device along the original so that a faithful representation of an image of a scanned original may be acquired. Typically, the captured image provided by a scanner is a pixel data array that is stored in memory in a digital format. A distortion-free image requires a faithful mapping of the original image to the pixel data array.

Information as to the travel of a scanning device along an original may be obtained by an optical navigation system comprising a photo-receiver array. Optical navigation systems utilizing primarily analog-based technology are known in the art. For example, optical navigation systems comprising a photo-receiver array, an analog spatial image enhancement filter, and an analog correlator with off-chip bias and control are known. While usable, the accuracy of such analog systems is not optimal since so much of the algorithmic processing of the image signal (e.g., filtration, correlation) is done in the analog domain. The complementary metal oxide silicon (CMOS) technology supporting chips performing this processing cause slight imperfections and variations in the physical CMOS structure (e.g., non-linearity, device mismatches, power supply issues), to substantially affect a predictable and repeatable performance of such analog systems. As a result, analog optical navigation systems are not very suitable for mass manufacture.

Digital optical navigation systems, such as the one disclosed in U.S. patent application Ser. No. 09/040,640 of Badyal et al. filed Mar. 18, 1998, entitled "CMOS Digital Optical Navigation Chip", have therefore been developed to overcome the disadvantages of analog optical navigation systems. Badyal discloses a CMOS digital integrated circuit (IC) chip on which an image is captured, digitized, and then processed on-chip in substantially the digital domain. A preferred embodiment of the IC disclosed by Badyal comprises imaging circuitry including a photo-receiver array for capturing an image and a charge transfer stage for generating a representative analog signal, conversion circuitry including an n-bit successive approximation register (SAR) analog-to-digital converter for converting the analog signal to a corresponding digital signal, filter circuitry including a spatial filter for edge and contrast enhancement of the corresponding image, compression circuitry for reducing the digital signal storage needs, correlation circuitry for processing the digital signal to generate result surface on which a minima resides representing a best fit image displacement between the captured image and previous images, interpolation circuitry for mapping the result surface into x-and y-coordinates, and an interface with a device using the chip, such as a hand-held scanner. The filter circuitry, the compression circuitry, the correlation circuitry and the interpolation circuitry are all advantageously embodied in an on-chip digital signal processor (DSP). The DSP embodiment allows precise algorithmic processing of the digitized signal with almost infinite hold time, depending on storage capability. The corresponding mathematical computations are thus no longer subject to the vagaries of a CMOS chip structure processing analog signals. As a result, precise and accurate navigation enables a predictable, reliable and manufacturable design. Parameters may also be programmed into the DSP's "software," making the chip tunable, as well as flexible and adaptable for different applications.

A preferred embodiment of a photo-receiver in the photo-receiver array disclosed by Badyal et al. is further described in U.S. Pat. No. 5,769,384 of Baumgartner et al. issued June 23, 1998, entitled "Low Differential Light Level Photoreceptors", and in U.S. patent application Ser. No. 09/024,092 of Knee et al. filed Feb. 17, 1998, now U.S. Pat. No. 6,104,020, entitled "Electronic Shutter for a Low Differential Light Level Photo-Receiver Cell". Operation of the photo-receivers described in Baumgartner et al. and Knee et al. is further described in U.S. Pat. No. 5,149,980 of Ertel et al. issued Sep. 22, 1992, entitled "Substrate Advance Measurement System Using Cross-correlation of Light Sensor Array Signals".

The above disclosed patents of Baumgartner et al. and Ertel et al., as well as the patent applications of Badyal et al. and Knee et al., are hereby incorporated by reference for all that they disclose.

SUMMARY OF THE INVENTION

A problem with constructing photo-receiver arrays and their associated read channels on a single IC is that it becomes difficult to adequately test the photo-receiver arrays and their read channels.

One method of testing these elements is by observing IDDQ currents (quiescent current draws) for the entire chip. A global test such as this will show if a device is shorted, or if large numbers of photoelements are not biased properly. However, it will not show if random pixels are dead. Optical testing has historically been done after packaging.

As array sizes grow and packaging costs rise, it is desirable to identify photo-receiver arrays with defects before they are packaged. The inventor has therefore devised methods and apparatus which enable the testing of photo-receiver arrays and their associated read channels either prior to, or after, they are packaged in an integrated circuit.

In summary, testing may be accomplished by injecting analog test voltages into 1) a multiplexor stage preceding a charge transfer stage, and 2) multiplexors preceding a number of analog-to-digital converters. In this manner, the analog-to-digital converters may be isolated from the charge transfer stage while test voltages are injected to the analog-to-digital converters. After proper operation of the analog-to-digital converters has been verified, additional test voltages may be used to write charges to integration capacitors of photo-receivers in a photo-receiver array. These charges may then be read out through the same multiplexors which were used to write them to the integration capacitors. When combined with illumination and shutter control of the photo-receivers, the write of test charges to the integration capacitors may be used to fully exercise and test the elements of a photo-receiver array and its read channels.

Utilizing the methods and apparatus disclosed herein, photo-receiver arrays and their read channels may be tested prior to the packaging of an IC such as an optical navigation IC. Next higher assembly costs may thereby be avoided if a photo-receiver array and/or its read channels is determined to be bad.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 1:
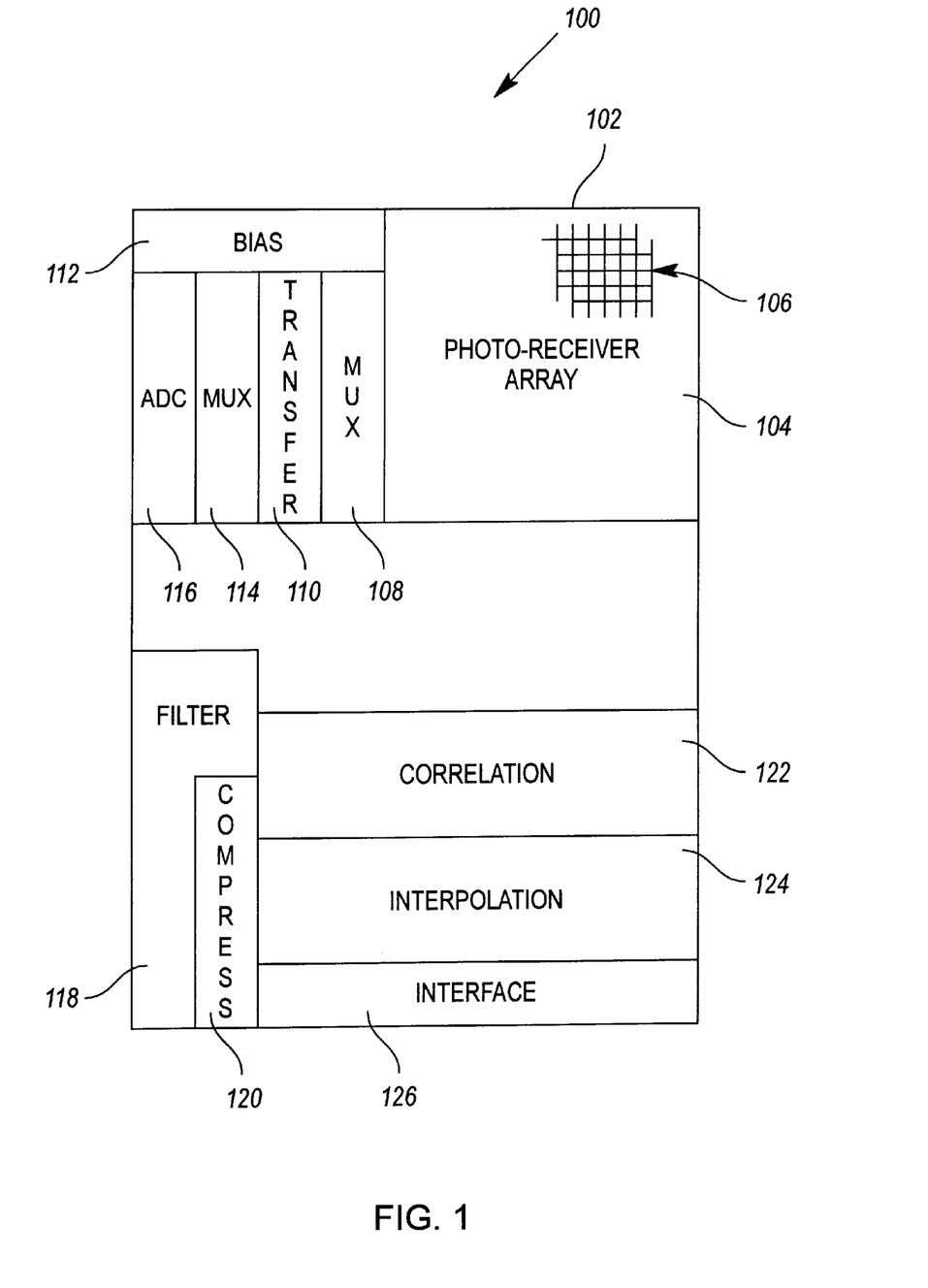
FIG. 1 is a plan view of an optical navigation IC.
Figure 2:
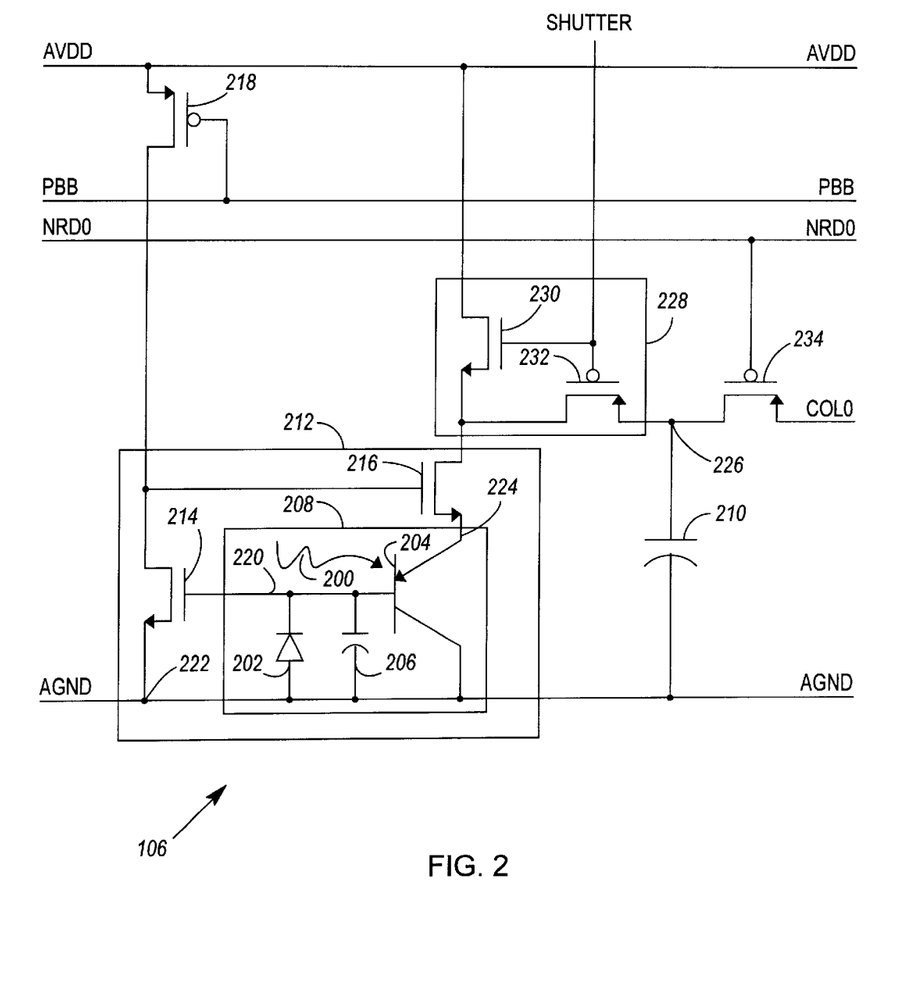
FIG. 2 is a schematic illustrating a single photo-receiver of the FIG. 1 IC.

Apparatus for testing a photo-receiver array 104 and its associated read channels 108/110/114/116 is illustrated in FIGS. 1-5, and may generally comprise a photo-receiver array 104 (FIGS. 1, 5), a number of multiplexors 108, a charge transfer stage 110, and a number of analog-to-digital converters 116. The photo-receiver array 104 may comprise a plurality of photo-receivers 300–328 (FIG. 3), 106, wherein each photo-receiver 300–328, 106 comprises a capacitor 210 (e.g., an integration capacitor; FIG. 2) for storing a charge which is indicative of how much light has entered the photo-receiver 300–328, 106. Each of the number of multiplexors 108 may comprise a first number of inputs, a second input, a number of select inputs, and an output. The first number of inputs of each multiplexor are provided for reading the charge off of at least one capacitor 210 of at least one of the plurality of photo-receivers 106. The second input of each multiplexor is provided for receiving test voltages. In operation, the select inputs of the number of multiplexors 108 allow each multiplexor's output to be coupled to one or more of its inputs. The charge transfer stage 110 is coupled to the outputs of the number of multiplexors 108, and when it receives charges stored on the capacitors 210 of the plurality of photo-receivers 300–328, 106, it converts the charges to analog voltages. The number of analog-to-digital converters 116 are coupled to outputs of the charge transfer stage 110, and provide for converting the analog voltages to digital values.

It is to be noted that in a simplest embodiment of the above apparatus, each of the "numbers" of elements may be limited to one such element. In this simplest embodiment, the apparatus becomes apparatus for testing a single photo-receiver 106 and its associated read channel 108/110/112/116.

It should also be noted that operation of the above apparatus is illustrative of a method of testing a photo-receiver array 104 and its associated read channels 108/110/114/116. In general, such a method comprises multiplexing a number of test voltages with outputs of photo-receivers 300–328, 106 in the photo-receiver array 104. Utilizing this multiplexing, charges may be written to the integration capacitors 210 of given ones of said photo-receivers 300–328, 106. This is accomplished by connecting the number of test voltages with outputs of the given ones of said photo-receivers 300–328, 106. Subsequent to writing charges to the integration capacitors 210 of said given ones of said one or more photo-receivers 300–328, 106, charges may be read from some or all of the integration capacitors 210 of the photo-receivers 300-328, 106 in the photo-receiver array 104. The charges may be read by again utilizing the afore-mentioned multiplexing, and connecting the outputs of the photo-receivers 300–328, 106 in the photo-receiver array 104 with a charge transfer stage 110 which converts the charges to analog voltages. Finally, the analog voltages may be converted to digital values utilizing an analog-to-digital converter 114, and then compared with expected digital values.

Having described methods and apparatus for testing a photo-receiver array 104 and its associated read channels 108/110/114/116 in general, the methods and apparatus will now be described in further detail.

The above recited methods and apparatus are preferably embodied in the CMOS optical navigation integrated circuit (IC) of FIG. 1. The IC comprises imaging circuitry 102 including a photo-receiver array 104 for capturing an image projected thereon and generating an analog signal representative thereof. In a preferred embodiment, each photo-receiver 106 of the photo-receiver array 104 includes a vertical parasitic photo transistor standard to CMOS technology. In a preferred embodiment, and as described further below with reference to DSP processing, each photo-receiver 106 in the array 104 is disposed to have a programmable shutter speed, and regions of array 104 are selectable to be active during operation of the imaging circuitry. Array 104 may be comprised of either photo transistors or photo diodes, according to the intended application of IC 100. The imaging circuitry further includes a first multiplexor stage 108, a charge transfer stage 110 for converting photo-receiver charges into voltage-based analog signals, and bias circuitry 112 for biasing the analog signal prior to digitization.

IC 100 further comprises a second multiplexor stage 114, and an n-bit SAR analog-to-digital converter 116 for converting the analog photo-receiver signals into corresponding digital values. Advantageously, the resolution and conversion rate of the analog-to-digital converter 116 are configurable according to specific applications and/or embodiments. It will be appreciated that the analog-to-digital converter 116 may be variously embodied and employed, and that two or more converters may be deployed in parallel to enhance the frame rate.

It will also be appreciated that digitizing the image enables many of the features of chip 100. DSP algorithms are available on-chip to manipulate the image precisely with infinite extended hold-time. Parameters programmable in the algorithms may be tuned to provide a very accurate imaging process that is both predictable and repeatable, and therefore highly manufacturable.

IC 100 further comprises filter circuitry 118, including a spatial filter for edge and contrast enhancement of the corresponding image. The spatial filter enables this enhancement by subduing or enhancing the high optical frequencies so as to correspondingly soften or sharpen edges of the image. Advantageously, filter circuitry 118 also compresses the digital signal, although compression may also be performed by separate compression circuitry 120 located on the IC 100.

The IC 100 further comprises correlation circuitry 122, which compares the digital signal with the corresponding signal generated for previous images (frames). The result of the comparison is a result surface on which a minima resides representing a best fit image displacement between the current image and previous ones. By following the minima on a series of result surfaces, x-y navigation information may be provided to an offchip processor. IC 100 also includes interpolation circuitry 124 for mapping the result surface into spatially-defining coordinates. In a preferred embodiment, these coordinates are orthogonally-referenced (i.e., x- and y-coordinates), although other conventions may be used, such as vector-referencing (i.e., angle and distance).

Finally, IC 100 comprises interface circuitry 126 for formatting the digital signal so as to be compatible for signal communication with a device in which the IC is to be used, such as a miniature or hand-held scanner.

It will be appreciated that filter circuitry 118, compression circuitry 120, correlation circuitry 122, and interpolation circuitry 124 are all advantageously embodied in an on-chip DSP. The DSP embodiment allows precise algorithmic processing of the digitized signal with almost infinite hold time, depending on storage capability. As a result, corresponding mathematical computations are not subject to the vagaries of CMOS chip structure processing analog signals. As a result, precise and accurate navigation enables a predictable, reliable and manufacturable design.

Parameters may also be programmed into the DSP's "software," making the IC 100 tunable, as well as flexible and adaptable for different applications. For example, the DSP can select regions of the photo-receiver array 104 to process. The "shutter speed" of the photo-receivers 106 also becomes programmable. Further, different filtration coefficients may be programmed into the filter circuitry 118 for different applications. Different correlation methods are selectable (e.g. |a−b| versus (a−b)$^2$, etc.). Spatial filtering algorithms which are too complex for analog circuitry are available in the digital domain. It will be appreciated that the foregoing programmable features are exemplary only.

The methods and apparatus disclosed herein are designed to test a photo-receiver array 104 and its associated read channels 108/110/114/116, and are specifically suited to testing photo-receiver arrays 104 and read channels 108/110/114/116 similar to those embodied in the aforedescribed optical navigation IC 100. In IC 100, the "associated read channels" which are the subject of test comprise multiplexor stage 108, charge transfer stage 110, multiplexor 114, and analog-to-digital converter 116.

To gain a better understanding of the elements of a photo-receiver array 104 which can be tested utilizing the methods and apparatus disclosed herein, an exemplary embodiment of the photo-receiver array 104 of IC 100 will now be described.

A photo-receiver array 104 comprising a number of photo-receivers 106 arranged in M columns and N rows is illustrated in FIG. 1. While the methods and apparatus described herein are applicable to one-dimensional photo-receiver arrays, and even singular photo-receivers, preferred embodiments of the methods and apparatus described herein will be described in conjunction with the M×N photo-receiver array 104 of FIG. 1.

FIG. 2 is a schematic illustrating a preferred embodiment of a singular photo-receiver 106 of the FIG. 1 photo-receiver array 104. Incoming light 200 is converted into a current that is integrated during a sample period. The stored value is periodically read out, so that it is available for a next step in a processing sequence. At the start of an integration cycle, photocurrent that is generated by means of a photodiode 202 is amplified by a PNP transistor 204. The photodiode 202 and the transistor 204, along with a parasitic capacitance 206, define a photoelement 208. The amplified photocurrent charges the integration capacitor 210 downwardly from its initial reference level.

The photodiode 202 of the photoelement 208 generates a current in response to its reception of light photons 200. The photodiode 202 is actually the base of the PNP transistor 204. The reverse bias diode capacitance 206 is a parasitic capacitance that may be large, depending on diode size. In a preferred embodiment of the FIG. 2 photoelement 208, the optical power on the photodiode 202 was determined to be about 1.1 nW. This causes a current of approximately 0.6 nA in the diode current source. Because of this low current level, amplification is needed to ensure that the optical variation signal, which is only approximately six percent of the constant photocurrent, will create sufficient voltage differences to be distinguished from noise.

The PNP transistor 204 of the photoelement 208 amplifies the photocurrent. The amplification provided by the transistor 204 allows use of an integration capacitor 210 that facilitates reproducability from photoelement to photoelement. In the absence of amplification, the low current from the photodiode 202 would require a very small capacitor as an integrator in order to get a 1 volt swing, e.g. 10 fF. Because of the parasitics, this would be difficult to reproduce on an element-to-element basis. Changing the photoelement 208 layout from a diode 202 to a substrate PNP 204 device is a convenient way of providing current amplification. A beta value of eighteen increases the output emitter current to 11.4 nA. Thus, an integration capacitor 210 of 0.20 pF can be used. This facilitates reproducability, and does not require excessive area.

A servo circuit 212 is formed by MOS transistors 214 and 216. The MOS transistors 214, 216 form a bias point amplifier with a common gate stage for the output of the phototransistor 204. Transistors 214 and 216 may sometimes be referred to as a "servo circuit". MOS transistor 218 supplies the bias current via analog power supply line AVDD when the proper signal is received from bias voltage line PBB. To achieve proper transfer of the current generated in the photoelement 208 to the integration capacitor 210, the photodiode 202 reverse voltage (i.e., the transistor base voltage) must be kept at a substantially constant level. If the voltage at the base node 220 were to be allowed to shift, the photocurrent would be at least partially consumed in charging and discharging the diode capacitance 206, rather than providing current to be amplified by the substrate PNP transistor 204.

The transistor base voltage at node 220 is kept at a substantially fixed level by the three MOS transistors 214, 216 and 218. While not critical to achieving the desired operation, in the embodiment of FIG. 2, the substantially fixed voltage level is approximately equal to the NMOS threshold level above AVDD at the collector node 222. The MOS transistors 214, 216, 218 operate as a negative feedback loop by means of transistor 216 operating as a source follower to the emitter node 224 of the PNP transistor 204. Thus, the base voltage is controlled by the emitter voltage of the transistor 204. This is possible because the base voltage, i.e. the photodiode output, has a very high DC impedance level. The bias technique of emitter control operated effectively during testing. From the output perspective, transistor 216 is a common gate stage that has an added advantage of providing additional isolation of the emitter node 224 and the base node 220 of the transistor from the voltage swing of a node 226.

The electronic shutter 228 is formed from NMOS transistor 230 and PMOS transistor 232. When a signal from input node SHUTTER is at a logic low, transistor 232 is in a conducting mode, and transistor 230 is in a non-conducting mode. In this state, the servo circuit 212 continues to discharge the integration capacitor 210. In this mode, electronic shutter circuit 228 is in an "open" mode. When a high logic signal is received from node SHUTTER, then transistor 230 is in a conducting mode, and transistor 232 is in a nonconducting mode. In this state the photo-generated emitter current from photoelement 208 is diverted from the integration capacitor 210 to the power supply line AVDD. In this mode, electronic shutter circuit 228 is in a "closed" mode, and integration capacitor 210 is not integrating any photo-generated charge. Thus, to end an integration period, electronic shutter circuit 228 is configured into a closed mode. During the closed mode, integration capacitor 210 holds its charge until it is read.

Sometime after an integration period, a read switch 234 is turned "on" via a logic signal from line NRD0 to output the stored value in integration capacitor 210 to a charge transfer stage 110 via node OUT. The read switch may be a PMOS transistor that is controlled by a read control line NRD0. In this manner, integration capacitor 210 holds its charge while the shutter circuit 228 is in a closed mode, and until it is read via read transistor 234. The operation of the charge transfer stage 110 pulls the node 226 up to a reference voltage (i.e., its pre-integration charge) so that a new integration period may be commenced. Sometime during the read process, the read control line NRD0 is caused to return to a logic low, and transistor 234 returns to a non-conducting state.

Figure 3:
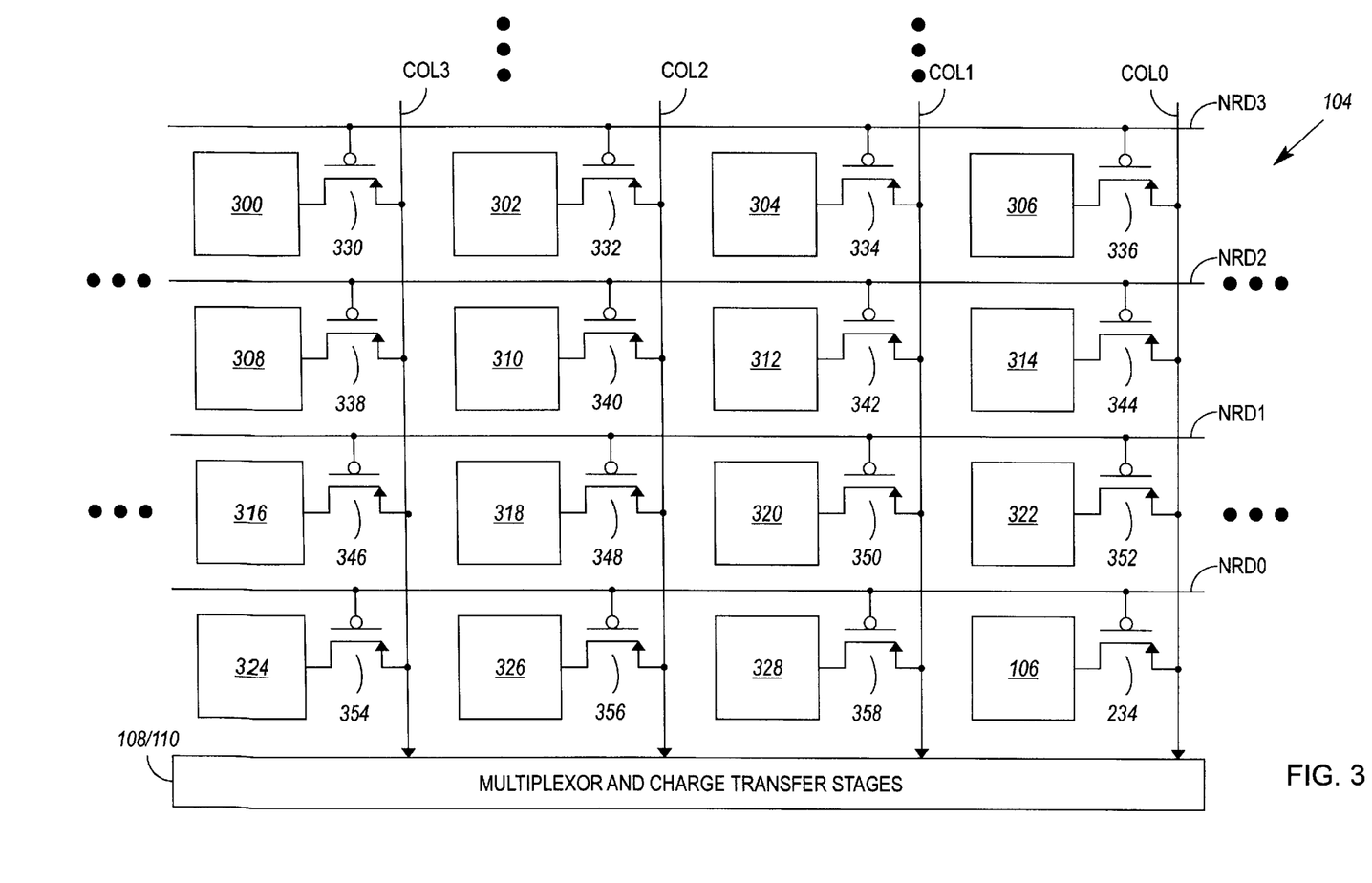
FIG. 3 is a schematic illustrating a row and column arrangement of the photo-receivers illustrated in FIG. 1 IC.

FIG. 3 illustrates a number of photo-receivers 300–328, 106 connected to form a photo-receiver array 104. The photo-receivers 300–328, 106 are arranged in rows and columns. Charges may be read from the integration capacitors of a row of photo-receivers by asserting a particular row select line (NRD0–3) so as to close the row select switches for a row. For example, row select switches 330–336 may be closed by asserting row select line NRD3, row select switches 338–344 may be closed by asserting row select line NRD2, row select switches 346–352 may be closed by asserting row select line NRD1, and row select switches 354–358 and 234 may be closed by asserting row select line NRD0. As suggested by the series of three dots extending to the left, right and top of FIG. 3, a photo-receiver array 104 may comprise more than the sixteen photo-receivers 300–328, 106 illustrated in FIG. 3. As previously stated, a preferred embodiment of the FIG. 1 IC 100 comprises a 47×47 array of photo-receivers. It is also possible that a photo-receiver array 104 may comprise less than the sixteen photo-receivers 300–328, 106 shown in FIG. 3.

When a row select line is asserted (e.g., NRD0), the charges stored on the integration capacitors of the photo-receivers (e.g., 324–328, 106) of that row are dumped onto column read lines COL0–COL3. At this point, multiplexor 108 and charge transfer 110 stages enable the read-out and conversion of the charges to analog voltages.

Figure 4:
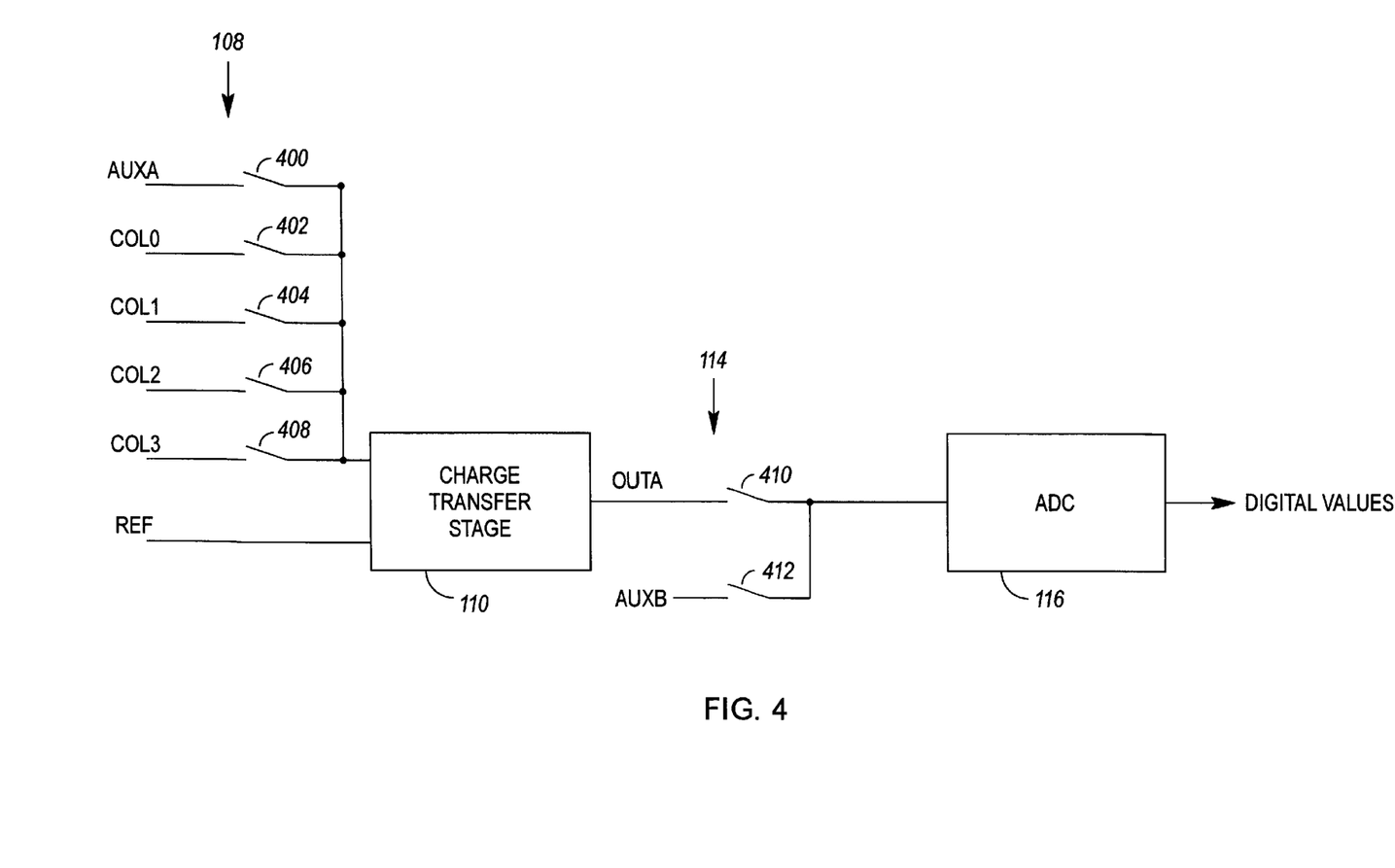
FIG. 4 is a schematic illustrating a read channel associated with the photo-receiver array contained within the FIG. 1 IC, the read channel comprising portions of the multiplexor stages, charge transfer stage, and analog-to-digital converter stage illustrated in FIG. 1 IC.
Figure 5:
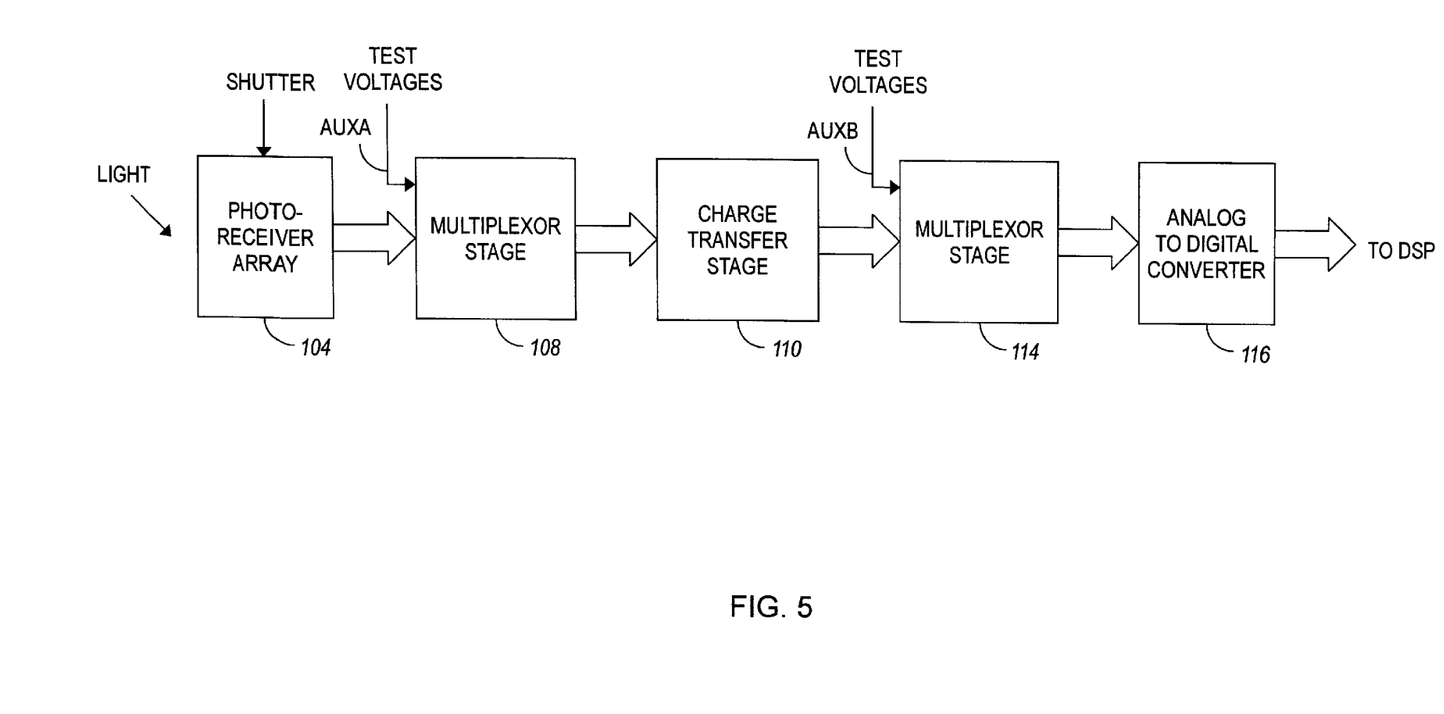
FIG. 5 is a block diagram of the photo-receiver array and associated read channels illustrated in FIG. 1 IC.

A preferred embodiment of the multiplexor 108 and charge transfer 110 stages illustrated in FIGS. 1 and 3 is illustrated in more detail in FIG. 4.

The charge transfer stage 110 is preceded by a first multiplexor stage 108. The inputs to the multiplexor stage 108 comprise charges carried on one or more of the FIG. 3 column read lines (e.g., COL0–COL3), and a test voltage injected via an auxiliary input (e.g., AUXA). The outputs of the multiplexor stage 108 are connected to the charge transfer stage 110. In FIG. 4, the single multiplexor preceding the charge transfer stage 110 is illustrated as a number of switches (e.g., 400–408). Select inputs provided to the multiplexor control the opening and closing of these switches 400–408 so that the multiplexor's output may be connected to one or more of its inputs. Although only one multiplexor precedes the charge transfer stage 108 in FIG. 4, an actual implementation of a photo-receiver array 104 and its read channels may require one or more multiplexors 108, as determined by the size of the photo-receiver array 104 being used in an application, loading limitations, speed requirements, and so on.

In a preferred embodiment, a multiplexor's output may be connected to its inputs as follows. First, the multiplexor's output may be individually connected to each of the column read lines connected to its inputs so that charges carried on these column read lines may be individually converted to analog voltages via the charge transfer stage 110. As charges are read, a reference voltage may be placed on the integration capacitors of each photo-receiver connected to a number of column read lines via row select switches. The reference voltage may then be read from the integration capacitors during a test mode. Alternatively, the photoelements associated with the integration capacitors receiving the reference voltage may be exposed to light (possibly via shutter control, as in FIG. 2) so that light readings and/or image data is stored by the integration capacitors. Afterwards, the light readings and/or image data may be read from the integration capacitors, and reference voltages may again be written to the integration capacitors so that the cycle may be repeated.

Second, the multiplexor's output may be connected to one or more of the column read lines connected to its inputs and the auxiliary input connected to its inputs so that a charge determined by the test voltage received through the auxiliary input may be placed on the integration capacitors of photo-receivers connected to the column read lines via row select switches. Subsequently, the charges on the integration capacitors may be read (either with or without their associated photoelements being exposed to light).

Third, the multiplexor's output may be connected to its auxiliary input so that a test charge may be applied to the charge transfer stage 110 independently of the photo-receiver array 104.

The outputs of the charge transfer stage (e.g., OUTA) are received by a second multiplexor stage 114. This additional multiplexor stage 114 is illustrated as switches 410, 412. Select lines controlling the close of switches such as switch 410 serve to connect outputs of the charge transfer stage 110 to an analog-to-digital converter (ADC) 116, while select lines controlling the close of switch 412 serve to connect an auxiliary input (which again carries a test voltage) to the ADC 116.

Utilizing the auxiliary inputs disclosed in FIG. 4 (i.e., AUXA, AUXB), a photo-receiver array 104 and its associated read channels 108/110/114/116 may be exercised to their fullest potential. It should be noted that each of inputs AUXA and AUXB will preferably be adapted to receive a range of analog test voltages which is sufficient to fully test the components of a photo-receiver array 104 and its read channels 108/110/114/116. For example, AUXA should be capable of supplying voltages representing full scale swings of the integration capacitors they are writing to. Likewise, AUXB should be capable of supplying voltages representing the full range of analog voltages which might appear at an input to ADC 116 during actual use of optical navigation IC 100.

Testing may begin with a check of the ADC 116. By opening switch 410 and supplying test voltages to the ADC 116 via switch 412 and input AUXB, proper operation of the ADC 116 may be confirmed.

Once proper operation of the ADC 116 is confirmed, charges may be written to the integration capacitors of various and/or all of the photo-receivers 300–328, 106 in the photo-receiver array 104. Patterns of charges may be written to the integration capacitors, such as: all highs, all lows, checkerboard, shifted checkerboard, and stripes. These charges may then be read out through appropriate read channels to verify whether elements of the photo-receiver array 104, multiplexor stage 108, charge transfer stage 110, and multiplexor stage 114 are stuck high, stuck low, shorted, etc. For example, a photo-receiver 106 may be verified for shorts with any of its nearest neighbors. Also, a column 306, 314, 322, 106 or row 324–328, 106 of photo-receivers may be verified for shorts with its nearest neighbors. Furthermore, photo-receivers 106, and/or their rows and columns, may be verified for shorts to global nets (e.g., power, ground, a read line, etc.). Additional verifications of a photo-receiver array 104 and its read channels 108/110/114/116 may be performed by combining 1) the write of test and/or reference voltages to integration capacitors with 2) the exposure of their associated photoelements 208 to light, and 3) the operation of applicable shutters (i.e., transistors 230 and 232 in FIG. 2). Illumination of photoelements 208 is critical to the test of servo circuits (i.e., transistors 214 and 216 in FIG. 2).

Throughout testing, digital values appearing on outputs of the ADC may be compared to standard values (or expected digital values), and judged as pass or fail.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method of testing a photo-receiver array and its associated read channels, comprising:
    a) first multiplexing, comprising multiplexing a number of first test voltages with outputs of photo-receivers in the photo-receiver array;
    b) writing charges to integration capacitors of given ones of said photo-receivers, by connecting the number of first test voltages with outputs of said given ones of said photo-receivers via said first multiplexing;
    c) subsequent to writing charges to the integration capacitors of said given ones of said one or more photo-receivers, reading charges off of the integration capacitors of said photo-receivers in the photo-receiver array, by connecting the outputs of said photo-receivers in the photo-receiver array with a charge transfer stage via said first multiplexing, and then converting said charges to analog voltages in said charge transfer stage;
    d) converting said analog voltages to digital values utilizing an analog-to-digital converter; and
    e) comparing said digital values to expected digital values.

2. A method as in claim 1, further comprising:
    a) second multiplexing, comprising multiplexing a number of second test voltages with outputs of said charge transfer stage;
    b) supplying said number of second test voltages to said analog-to-digital converter by connecting said number of second test voltages to inputs of said analog-to-digital converter via said second multiplexing;
    c) converting said number of second test voltages to digital values in said analog-to-digital converter; and
    d) comparing said digital values to expected digital values.

3. A method as in claim 2, further comprising:
    a) disabling the charge transfer stage, and preventing the reading of charges off of the integration capacitors of said photo-receivers, during the writing of charges to the integration capacitors of given ones of said photo-receivers;
    b) illuminating said given ones of said photo-receivers, subsequent to writing charges to the integration capacitors of said given ones of said photo-receivers, and prior to reading charges off of the integration capacitors of said one or more photo-receivers;
    c) opening shutters associated with said given ones of said photo-receivers, subsequent to illuminating said given ones of said photo-receivers, and prior to reading charges off of the integration capacitors of said given ones of said photo-receivers; and
    d) closing said shutters associated with said given ones of said photo-receivers, subsequent to opening said shutters, and prior to reading charges off of the integration capacitors of said given ones of said photo-receivers.

4. A method as in claim 1, wherein writing charges to the integration capacitors of given ones of said photo-receivers comprises writing charges representing a high level charge limit for each of said integration capacitors.

5. A method as in claim 1, wherein writing charges to the integration capacitors of given ones of said photo-receivers comprises writing charges representing a low level charge limit for each of said integration capacitors.

6. A method as in claim 1, wherein writing charges to the integration capacitors of given ones of said photo-receivers comprises writing charges for creating a checkerboard pattern on said given ones of said photo-receivers.

7. A method as in claim 1, wherein writing charges to the integration capacitors of given ones of said photo-receivers comprises writing charges for creating a stripes pattern on said given ones of said photo-receivers.

8. A method as in claim 1, further comprising illuminating said given ones of said photo-receivers, subsequent to writing charges to the integration capacitors of said given ones of said photo-receivers, and prior to reading charges off of the integration capacitors of said given ones of said photo-receivers.

9. A method as in claim 8, further comprising opening shutters associated with said given ones of said photo-receivers, subsequent to illuminating said given ones of said photo-receivers, and prior to reading charges off of the integration capacitors of said given ones of said photo-receivers.

10. A method as in claim 9, further comprising closing said shutters associated with said given ones of said photo-receivers, subsequent to opening said shutters, and prior to reading charges off of the integration capacitors of said given ones of said photo-receivers.

11. A method as in claim 1, further comprising disabling the charge transfer stage, and preventing the reading of charges off of the integration capacitors of said photo-receivers, during the writing of charges to the integration capacitors of given ones of said photo-receivers.

12. Apparatus, comprising:
a) a photo-receiver comprising a capacitor for storing a charge which is indicative of how much light has entered the photo-receiver;
b) a first multiplexor comprising an input for reading a charge off of said capacitor, an input for receiving a first test voltage, a number of select inputs, and an output, wherein the select inputs allow for coupling the first multiplexor's output to one or more of its inputs;
c) a charge transfer stage, coupled to the output of the first multiplexor, for converting the charge stored on the capacitor to an analog voltage; and
d) an analog-to-digital converter, coupled to an output of the charge transfer stage, for converting the analog voltage to a digital value.

13. Apparatus as in claim 12, further comprising a second multiplexor, comprising an input for receiving an output from the charge transfer stage, an input for receiving a second test voltage, a number of select inputs, and an output coupled to the analog-to-digital converter, wherein the select inputs allow for coupling the second multiplexor's output to one of its inputs.

14. Apparatus, comprising:
a) a photo-receiver array, the photo-receiver array comprising a plurality of photo-receivers, each photo-receiver comprising a capacitor for storing a charge which is indicative of how much light has entered the photo-receiver;
b) a first number of multiplexors, each of the first number of multiplexors comprising:
  i) a first number of inputs for reading the charge off of at least one capacitor of at least one of the plurality of photo-receivers;
  ii) a second input for receiving first test voltages;
  iii) a number of select inputs; and
  iv) an output, wherein the select inputs allow for coupling the multiplexor's output to one or more of its inputs;
c) a charge transfer stage, coupled to the outputs of the first number of multiplexors, for converting the charges stored on the capacitors of the plurality of photo-receivers to analog voltages; and
d) a number of analog-to-digital converters, coupled to outputs of the charge transfer stage, for converting the analog voltages to digital values.

15. Apparatus as in claim 14, further comprisng:
a) a number of row select switches; wherein:
b) the plurality of photo-receivers of the photo-receiver array are arranged in rows and columns of photo-receivers; and
c) each of the first number of inputs of the first number of multiplexors is switchably connected to a column of photo-receivers of the photo-receiver array via one or more of the number of row select switches.

16. Apparatus as in claim 14, further comprising a second number of multiplexors, each of the second number of multiplexors comprising:
a) a first number of inputs for receiving a number of outputs from the charge transfer stage;
b) a second input for receiving second test voltages;
c) a number of select inputs; and
d) an output coupled to one of the number of analog-to-digital converters, wherein the select inputs allow for coupling the multiplexor's output to one of its inputs.

* * * * *